(12) United States Patent
Beer et al.

(10) Patent No.: US 9,337,155 B2
(45) Date of Patent: May 10, 2016

(54) SEMICONDUCTOR COMPONENT WITH MOISTURE BARRIER FOR SEALING SEMICONDUCTOR BODY

(71) Applicant: Infineon Technologies AG, Neubiberg (DE)

(72) Inventors: Gottfried Beer, Nittendorf (DE); Juergen Hoegerl, Regensburg (DE); Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 42 days.

(21) Appl. No.: 14/207,777

(22) Filed: Mar. 13, 2014

(65) Prior Publication Data

US 2014/0284624 A1 Sep. 25, 2014

(30) Foreign Application Priority Data

Mar. 22, 2013 (DE) .......................... 10 2013 205 138

(51) Int. Cl.
| | |
|---|---|
| H01L 23/31 | (2006.01) |
| H01L 25/07 | (2006.01) |
| H01L 23/00 | (2006.01) |
| H01L 23/29 | (2006.01) |
| H01L 25/00 | (2006.01) |
| H01L 29/16 | (2006.01) |
| H01L 21/56 | (2006.01) |

(52) U.S. Cl.
CPC ............ *H01L 23/564* (2013.01); *H01L 23/293* (2013.01); *H01L 24/48* (2013.01); *H01L 25/50* (2013.01); *H01L 29/1608* (2013.01); *H01L 21/561* (2013.01); *H01L 21/568* (2013.01); *H01L 23/3107* (2013.01); *H01L 23/3135* (2013.01); *H01L 25/072* (2013.01); *H01L 2224/32225* (2013.01); *H01L 2224/48091* (2013.01); *H01L 2224/48227* (2013.01); *H01L 2224/48472* (2013.01); *H01L 2224/48491* (2013.01); *H01L 2224/73265* (2013.01); *H01L 2924/00014* (2013.01); *H01L 2924/1301* (2013.01); *H01L 2924/1306* (2013.01); *H01L 2924/13055* (2013.01); *H01L 2924/13062* (2013.01); *H01L 2924/13091* (2013.01); *H01L 2924/181* (2013.01)

(58) Field of Classification Search
CPC .................................................... H01L 23/142
See application file for complete search history.

(56) References Cited

U.S. PATENT DOCUMENTS

| | | | |
|---|---|---|---|
| 5,353,498 A | 10/1994 | Fillion et al. | |
| 7,271,477 B2 * | 9/2007 | Saito ................ | H01L 23/49575 257/686 |
| 7,994,646 B2 | 8/2011 | Mahler et al. | |
| 2002/0048905 A1 | 4/2002 | Ikegami et al. | |
| 2010/0148381 A1 | 6/2010 | Mahler et al. | |
| 2012/0049263 A1 | 3/2012 | Lin | |
| 2012/0061812 A1 | 3/2012 | Otremba | |
| 2012/0286292 A1 | 11/2012 | Nakayama et al. | |
| 2012/0319249 A1 | 12/2012 | Uchida et al. | |

FOREIGN PATENT DOCUMENTS

DE 102009044863 A1 10/2010

\* cited by examiner

*Primary Examiner* — Stephen W Smoot
(74) *Attorney, Agent, or Firm* — Murphy, Bilak & Homiller, PLLC

(57) ABSTRACT

A semiconductor component includes a semiconductor body having a top side and a bottom side opposite the top side. A top metallization is applied to the top side and a bottom metallization is applied to the bottom side. A moisture barrier completely seals the semiconductor body in cooperation with the top metallization and the bottom metallization.

19 Claims, 16 Drawing Sheets

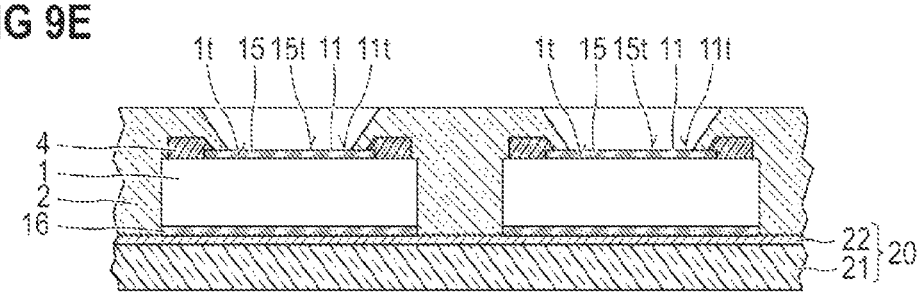
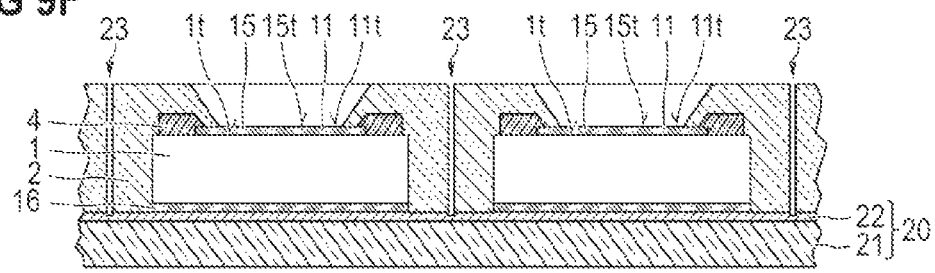
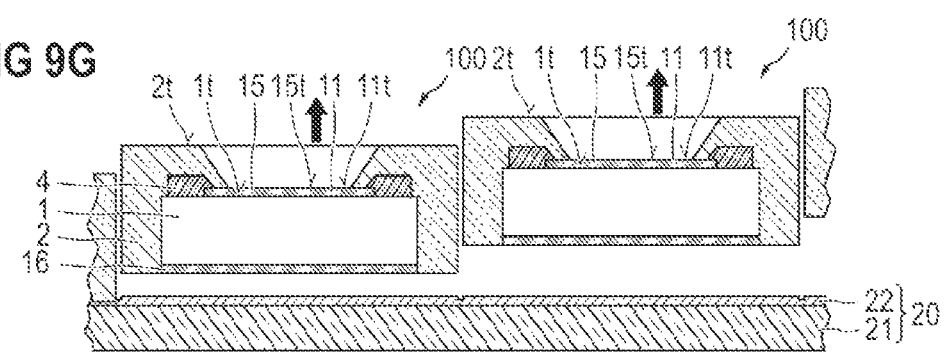
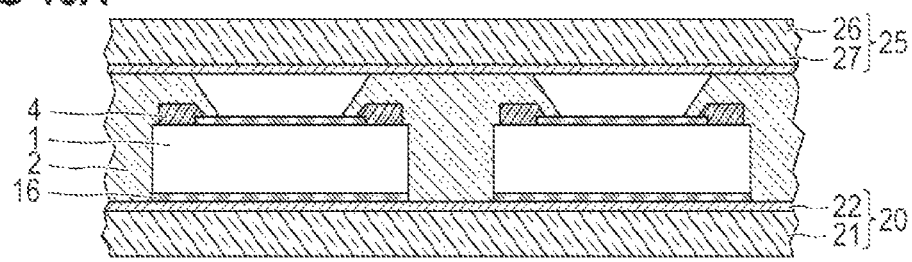

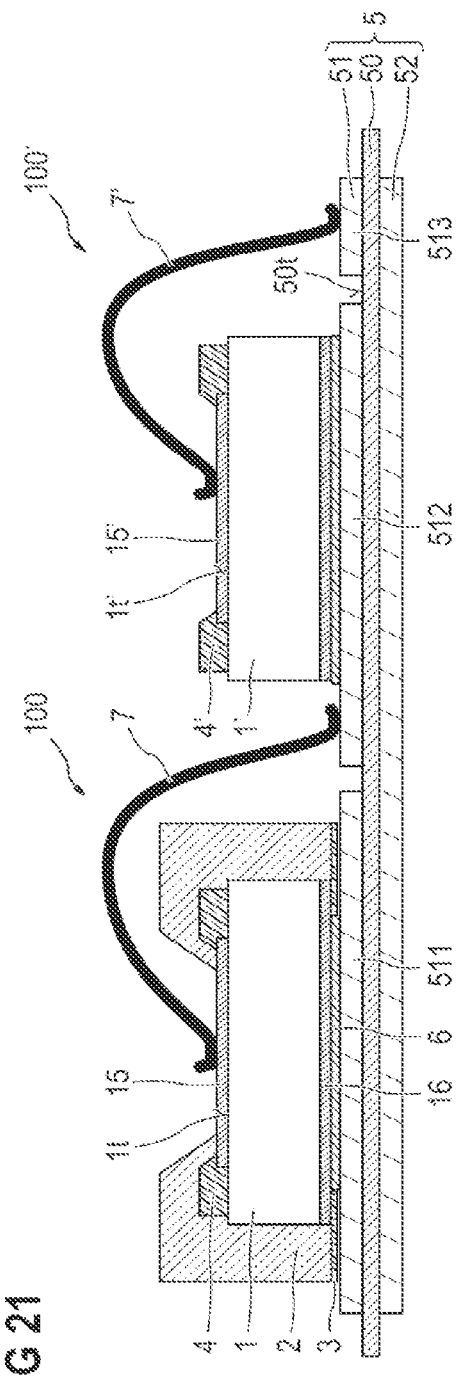
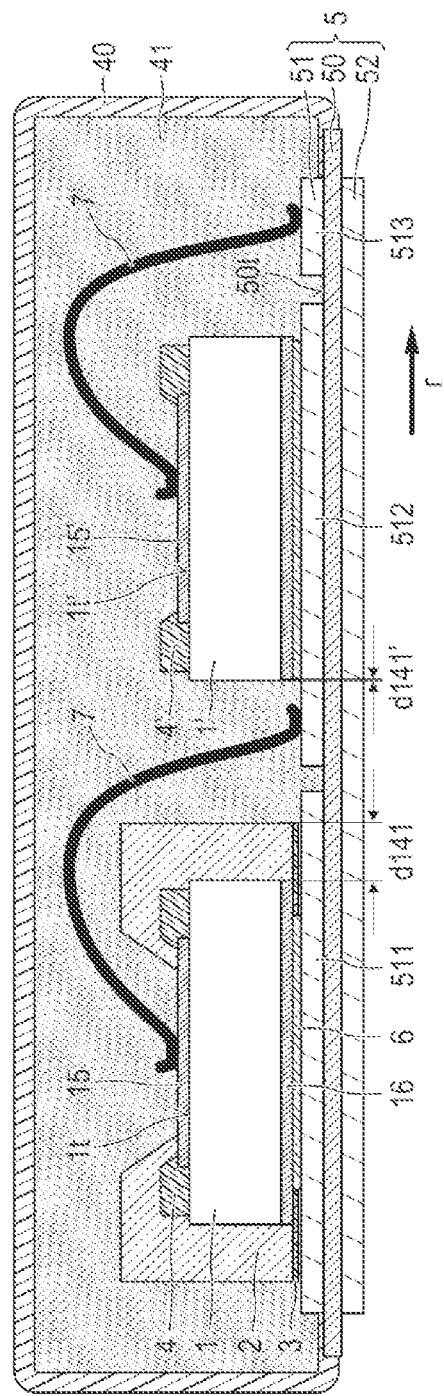

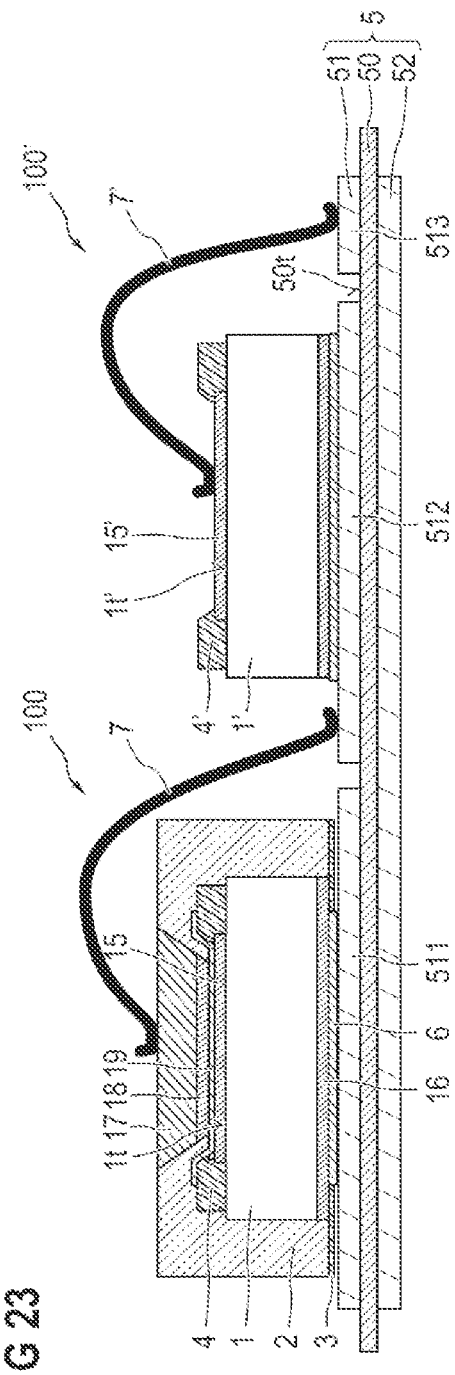
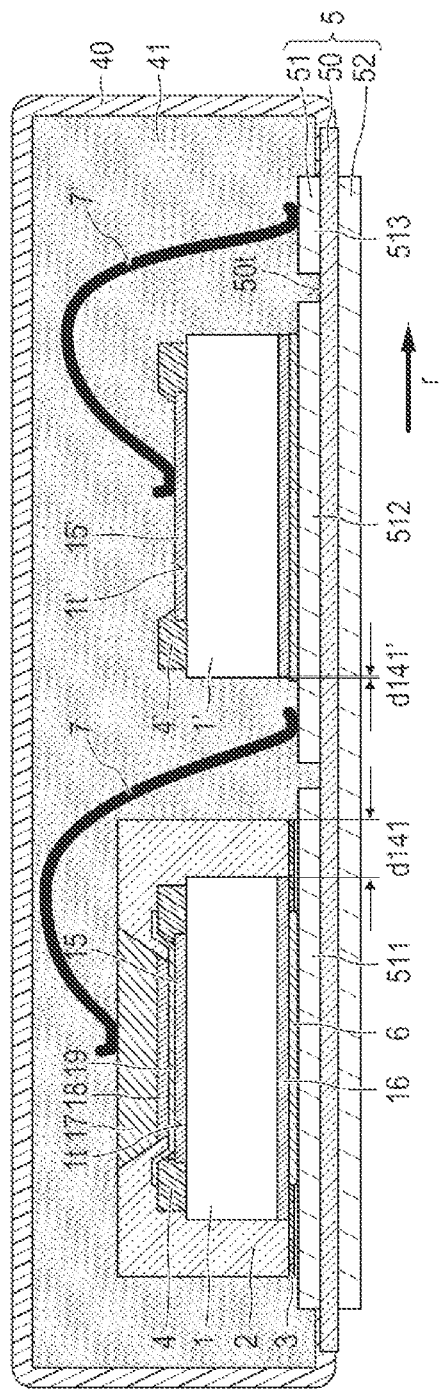

SEMICONDUCTOR COMPONENT WITH MOISTURE BARRIER FOR SEALING SEMICONDUCTOR BODY

PRIORITY CLAIM

This application claims priority to German Patent Application No. 10 2013 205 138.7, filed on 22 Mar. 2013, the content of said German application incorporated herein by reference in its entirety.

TECHNICAL FIELD

The invention relates to semiconductor components and semiconductor modules and to methods for producing them.

BACKGROUND

Semiconductor components, which are also used in semiconductor modules, for example, are often mounted in unencapsulated form on a circuit carrier and then, in particular also in order to keep moisture away from the semiconductor chip, are installed in a module housing. In this case, the semiconductor chip itself can optionally be embedded into a soft potting compound such as a silicone gel, for example, which is filled into the module housing. For conventional semiconductor chips based on a silicon semiconductor body, this type of mounting affords sufficient protection in relation to damage brought about by moisture-dictated corrosion.

However, semiconductor chips comprising a semiconductor body based on silicon carbide are increasingly being used as well. Such semiconductor chips based on silicon carbide are often operated at higher electric field strengths in the semiconductor body of the chip than occur in a semiconductor body of a conventional semiconductor chip that is not based on silicon carbide (SiC). On account of the high field strengths, there is an increased tendency toward corrosion in such semiconductor chips based on silicon carbide.

SUMMARY

Embodiments described herein provide a semiconductor component which is sufficiently protected against corrosion and the structure of which allows, inter alia, the use of a semiconductor body based on silicon carbide. Other embodiments described herein provide a semiconductor module comprising such a semiconductor component and methods for producing such a semiconductor component and such a semiconductor module.

One aspect of the invention relates to a semiconductor component. The latter has a semiconductor body having a top side and a bottom side opposite the top side. A structured or unstructured top metallization is applied to the top side, and a bottom metallization is applied to the bottom side. The semiconductor body, the top metallization and the bottom metallization form a composite. A dielectric moisture barrier is applied to the semiconductor body in such a way that—together with the top metallization and the bottom metallization—it completely seals the semiconductor body. In this case, the seal can optionally completely consist of the moisture barrier, the top metallization and the bottom metallization. In this case, the top metallization, the bottom metallization and the moisture barrier form a closed encapsulation that completely encloses the semiconductor body. The moisture barrier can consist of a uniform material or of a homogeneous material mixture, for example. In any case the moisture barrier can make mechanical contact with the semiconductor body indirectly or directly.

The semiconductor body can be produced from an arbitrary basic semiconductor material, for example from silicon carbide. In this sense, "basic semiconductor material" is understood to mean the type of semiconductor material in which, for realizing the desired component (e.g. diode, IGBT, MOSFET, JFET, thyristor, etc.), doped regions are produced and into which trenches are introduced and to which dielectric insulation layers or conductor layers/conductor tracks composed of metal or composed of polycrystalline semiconductor material, etc., are applied.

The semiconductor component is furthermore configured such that it can be processed, i.e. installed and electrically contact-connected, like a conventional semiconductor chip, i.e. like a semiconductor chip that does not have such a moisture barrier. By means of the moisture barrier, penetration of moisture and other harmful substances from the environment of the semiconductor component as far as the semiconductor body is prevented or at least significantly delayed in comparison with a conventional semiconductor component that does not have such a moisture barrier.

In order to produce such a semiconductor component, the moisture barrier can be applied to a composite, such as was explained above, in such a way that the semiconductor body is completely sealed toward the outside by the top metallization, the bottom metallization and the moisture barrier. The material of the moisture barrier is a dielectric, for example a plastic. The material of the moisture barrier can for example comprise one or more polycondensed polymers (e.g. an epoxy resin or a polyurethane-based material) or consist of one or more polycondensed polymers.

The moisture barrier can be applied, for example, by the composite being encapsulated with a pasty material. After encapsulation by molding, the molding compound is cured and then forms the moisture barrier. If the encapsulation is effected by encapsulation by molding, the pasty state of the material that is required for encapsulation by molding can be brought about by the material—for the purpose of encapsulation by molding—being heated and thereby softened, which is possible with a thermoplastic material, for example. The curing of the material after molding can then be effected by the material being cooled. However, there is also the possibility of using a resin-based pasty material which is cured after encapsulation by molding with the aid of an admixed curing agent and/or with the aid of a heat treatment step and/or by irradiation with ultraviolet light.

In order to ensure that contact can be made with the top and bottom metallizations after the production of the moisture barrier, they can be partly covered during molding. Molding can be effected, in particular, by the composite being introduced into a mold and encapsulated with the pasty compound by injection molding, or by the pasty compound being applied to the semiconductor chip and pressed on the composite by means of a die.

Such a (first) semiconductor component can be arranged together with a second, conventional semiconductor component, which does not have such a moisture barrier, on a circuit carrier and can be cohesively connected thereto, thereby giving rise to a semiconductor module. In this case, the second semiconductor component can optionally have a semiconductor body produced from a different basic semiconductor material than silicon carbide.

At least if the semiconductor body of the first semiconductor component comprises a semiconductor body produced from the basic semiconductor material silicon carbide, the semiconductor module, owing to the moisture sensitivity reduced by the moisture barrier of the first semiconductor component, has an increased service life compared with an otherwise identical semiconductor module in which the first semiconductor component is not equipped with the moisture barrier.

Those skilled in the art will recognize additional features and advantages upon reading the following detailed description, and upon viewing the accompanying drawings.

BRIEF DESCRIPTION OF THE DRAWINGS

The invention will be explained below using exemplary embodiments with reference to the appended figures. The illustration in the figures is not to scale. In the figures, identical reference symbols indicate identical elements with the same function. Unless stated otherwise, the elements, features, methods and method steps shown in the various figures can be combined with one another in any desired manner provided that they are not mutually exclusive.

FIGS. 10A-10E show different steps for producing a semiconductor component embodied in accordance with FIGS. 1 to 3.

FIG. 21 shows a vertical section through a semiconductor module comprising a first semiconductor component embodied in accordance with FIGS. 1 to 3 and equipped with a moisture barrier, and comprising a further semiconductor component, which does not have such a moisture barrier.

FIG. 22 shows a semiconductor module in accordance with FIG. 21, which additionally has a housing into which a soft potting compound is filled.

FIG. 23 shows a vertical section through a semiconductor module comprising a first semiconductor component embodied in accordance with FIGS. 11 to 13 and equipped with a moisture barrier, and comprising a further semiconductor component, which does not have such a moisture barrier; and FIG. 24 shows a semiconductor module in accordance with FIG. 23, which additionally has a housing into which a soft potting compound is filled.

DETAILED DESCRIPTION

The features shown in the different figures and exemplary embodiments can be combined with one another in any desired manner, provided that the relevant features are not mutually exclusive.

Figure 1:
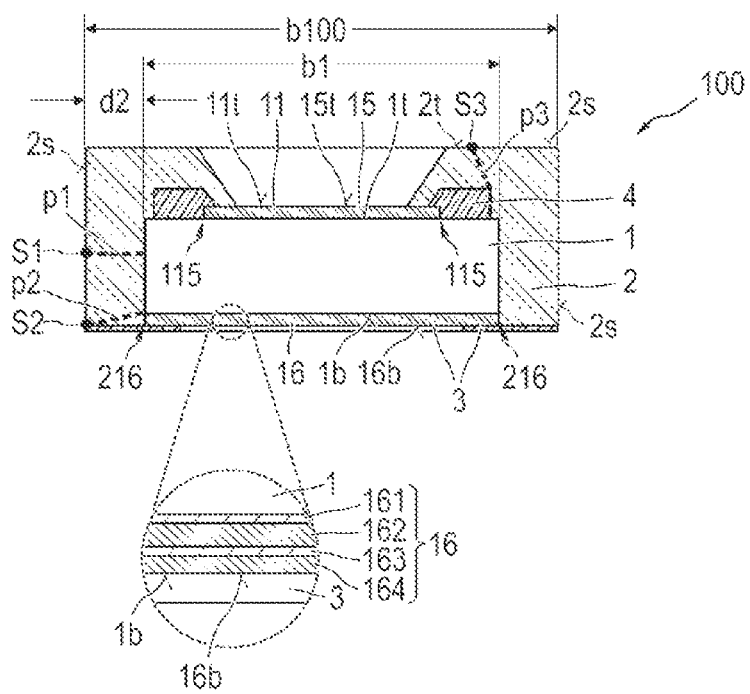
FIG. 1 shows a vertical section through a semiconductor component having a moisture barrier.

FIG. 1 shows a vertical section through a semiconductor component 100. The semiconductor component 100 comprises a semiconductor body 1, which is merely illustrated schematically. In order to realize the desired function of the semiconductor component, the semiconductor body 1 can have p-doped and n-doped semiconductor regions. The semiconductor component 100 can be embodied for example as a diode, as an insulated gate field effect transistor (IGFET=Insulated Gate Field Effect Transistor), e.g. as an IGBT or MOSFET, or as a junction field effect transistor (JFET=Junction Field Effect Transistor), but also as a thyristor or as any other active semiconductor component.

The semiconductor body 1 has a top side $1t$ and a bottom side $1b$ opposite the top side $1t$. Within the meaning of the present application, the terms "at the top", "at the bottom", "top side" and "bottom side" should be understood in each case relative to the position of the top side $1t$ and the bottom side $1b$. If a reference numeral is succeeded by a "t" ("t"="top"), then this is taken to designate a side or a surface of that element which is identified by the reference numeral without "t", the side or surface being situated—in the sense explained above—at the top or at the top side of the relevant element. Correspondingly, a succeeding "b" ("b"="bottom") means that this is taken to designate a side or a surface of that element which is identified by the reference numeral without "b", the side or surface being situated—in the sense explained above—at the bottom or at the bottom side of the relevant element.

In this regard, by way of example, a top metallization 11 embodied as a layer is applied to the top side 1*t*, and a bottom metallization 16 embodied as a layer is applied to the bottom side 1*b*. The top side of the top metallization 11 is accordingly designated by "11*t*" because it is situated "at the top" in the sense explained above, and the bottom side of the bottom metallization 16 is correspondingly designated by "16*t*", since it is situated "at the bottom" in the sense explained above.

The semiconductor body 1, the top metallization 11 and the bottom metallization 16 form a composite, to which a dielectric moisture barrier 2 is applied, which can consist of a uniform material or of a homogeneous material mixture. In this context it is pointed out that, within the meaning of the present invention, a material mixture is also designated as "material". Together with the top metallization 11 and the bottom metallization 16, the moisture barrier 2 completely seals the semiconductor body 1, as a result of which the penetration of water vapor from the external environment of the semiconductor component 100 to the semiconductor body 1 is prevented or at least made more difficult. The top metallization 11, the bottom metallization 16 and the moisture barrier 2 form a closed encapsulation that completely encloses the semiconductor body 1. In this case, the moisture barrier 2 makes contact with the semiconductor body 1 (i.e. a doped or undoped semiconductor material) directly. As an alternative thereto, however, the semiconductor body 1 could also be provided with an additional coating arranged between the semiconductor body and the moisture barrier 2.

In order to enable electrical contact to be made with the top metallization 11 of the semiconductor component 100 from the external environment thereof, the top metallization 11 has, on its top side 11*t* facing away from the semiconductor body 1, a surface section that is not covered by the moisture barrier 2. At least in the uninstalled state of the semiconductor component 100, that is to say in particular if the semiconductor component 100 is not mounted on a circuit carrier and if neither the top metallization 11 nor the bottom metallization 16 is electrically contact-connected, said surface section is freely accessible from the external environment of the semiconductor component 100 and can therefore be electrically contact-connected.

The penetration of water vapor from the external environment of the semiconductor component 100 as far as the semiconductor body 1 can be avoided or reduced firstly by the use of a material having a low diffusion coefficient for the moisture barrier 2, and/or by ensuring that the distance that has to be covered by a water molecule from the freely accessible outer surface of the moisture barrier 2 to the semiconductor body 1 is chosen to be as long as possible.

By way of example, a material having a diffusion constant of less than $5 \times 10^{-7}$ cm$^2$/sec for water vapor at a temperature of 30° C. can be chosen for the moisture barrier 2. Such materials are available for example in the form of polycondensed polymers such as epoxy resins or epoxy resin mixtures, for example, or polyurethane-based materials, which have to be cured (crosslinked) for producing the moisture barrier, which can optionally be effected by adding a curing agent.

As an alternative or in addition to the diffusion coefficient mentioned, for the uninstalled semiconductor component 100 it may hold true that for any arbitrary location S1, S2, S3 on the surface that is freely accessible from the external environment of the semiconductor component 100, the shortest path p1, p2 or p3 which leads from said location S1, S2 or S3 to the semiconductor body 1 and which runs exclusively within the moisture barrier 2 has a length of at least 50 μm.

The reference sign "11" identifies the entire top metallization 11 applied to the top side 1*t* of the semiconductor body 1, and the reference sign "15" identifies a top metallization layer 15, which can be embodied as a single metallization layer or as a layer stack comprising two or more partial metallization layers. In the example shown, the top metallization 11 and the top metallization layer 15 are identical. Optionally, however, the top metallization 11 can also comprise one or more further metallizations applied to the top metallization layer 15.

In any case the top metallization layer 15 can consist of aluminum completely or to an extent of at least 90 atom %. In principle, however, any other highly electrically conductive materials or material combinations can be used for the top metallization 11 and the top metallization layer 15.

The bottom metallization 16 can likewise consist of a metal or of a homogeneous metal alloy or alternatively, as is shown in the enlarged excerpt in accordance with FIG. 1, of a layer stack comprising two or more partial layers. In the example shown, the metallization 16 comprises a first partial metallization 161 composed of titanium, a second partial metallization 162 composed of nickel, a third partial metallization 163 composed of titanium and a fourth partial metallization 164 composed of silver, which, proceeding from that side of the metallization 16 which faces the semiconductor body 1, are arranged successively in a direction away from the semiconductor body 1.

FIG. 1 likewise shows an optional polyimide layer 4, which completely covers the edge 115 of the interface between the top metallization layer 15 and the semiconductor body 1.

A protective layer 3, for example a layer composed of a soldering resist, can likewise optionally be provided, said layer completely covering the bottom edge 216 of the interface between the moisture barrier 2 and the lateral edge of the bottom metallization 16.

As is furthermore shown in FIG. 1, the top side 11*t* of the top metallization 11 and/or the top side 15*t* of the top metallization layer 15 can be set back relative to the top side 2*t* of the moisture barrier 2 in the direction of the semiconductor body 1.

Figure 2:
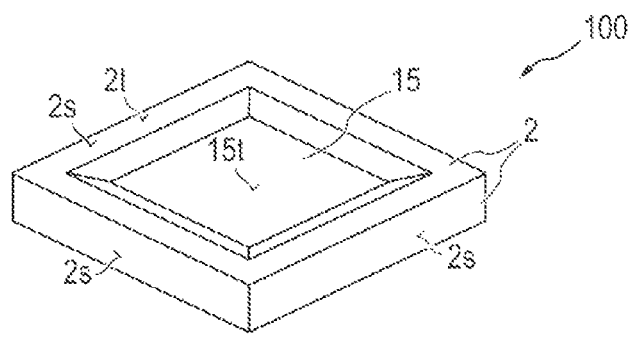
FIG. 2 shows a perspective view of the top side of the semiconductor component in accordance with FIG. 1.
Figure 3:
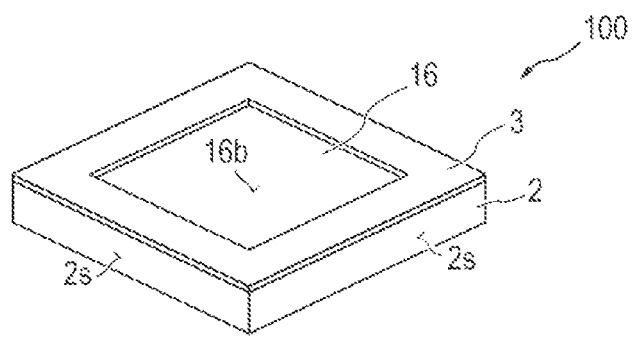
FIG. 3 shows a perspective view of the bottom side of the semiconductor component in accordance with FIG. 1.

FIG. 2 shows a perspective view of the top side of the semiconductor component 100 in accordance with FIG. 1, and FIG. 3 shows a view of the bottom side. As can be discerned in FIG. 3, the protective layer 3 forms a closed ring.

Figure 4:
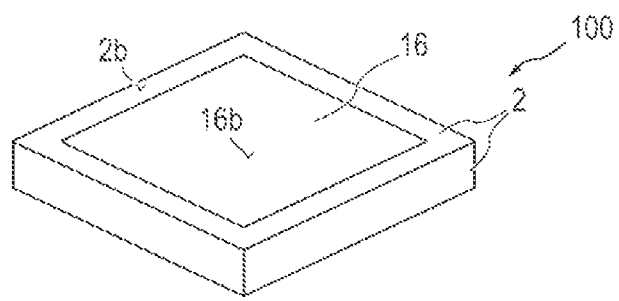
FIG. 4 shows a perspective view of the bottom side of a semiconductor component, the construction of which differs from the construction of the semiconductor component shown in FIG. 1 merely in the absence of the soldering resist layer at the bottom side.

Since the protective layer 3 is optional, as mentioned, FIG. 4 shows another alternatively configured semiconductor component 100, which differs from the semiconductor component explained with reference to FIGS. 1 to 3 merely in the absence of the protective layer 3. In this case, the bottom side 2*b* of the moisture barrier 2 and the bottom side of the bottom metallization 16 facing away from the semiconductor body 1 can lie flush against one another and can be arranged in one plane, for example.

Figure 5:
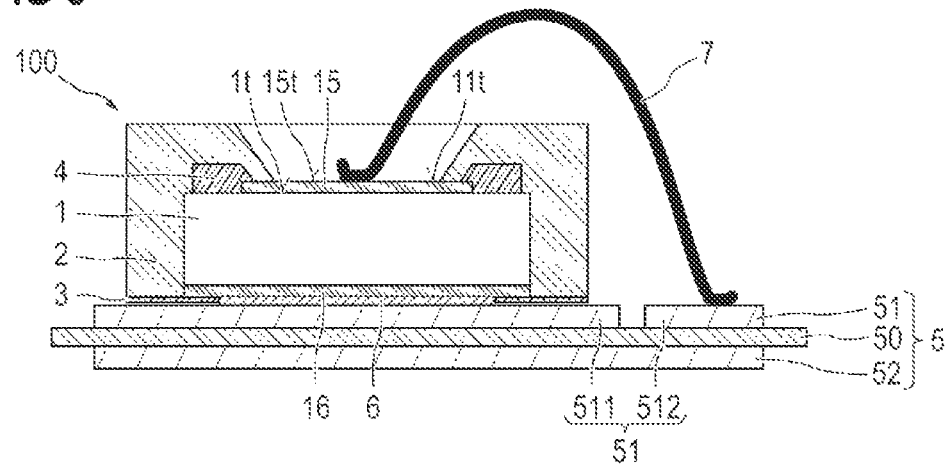
FIG. 5 shows a semiconductor module comprising a circuit carrier, on which a semiconductor component in accordance with FIGS. 1 to 3 is mounted.

FIG. 5 shows a vertical section through a semiconductor module in which a semiconductor component 100 configured on the basis of FIGS. 1 to 3 is cohesively connected to a section 511 of a top metallization layer 51 of a circuit carrier 5 by means of an electrically conductive connecting layer 6.

The connecting layer 6 can be, for example, a solder layer, or a layer which was produced by the sintering of a paste containing silver powder and which accordingly contains a sintered silver powder. In any case the connecting layer 6 makes contact both with the section 511 of the top metallization layer 51 and with the bottom metallization 16 of the semiconductor component 100.

Furthermore, the top metallization 11 is electrically connected by means of a bonding wire 7. For this purpose, at a first bonding location, the bonding wire 7 is bonded to the top side 11t of the top metallization 11 directly by wire bonding. Merely by way of example, at a further bonding location, the bonding wire 7 is bonded to a different section 512 of the top metallization 51 of the circuit carrier 5. In principle, however, the second bonding location need not be situated at a section 52 of the top metallization 51 of the circuit carrier 5. Rather, the second bonding location can be situated at any arbitrary other electrically conductive connection point of the semiconductor module.

Instead of a bonding wire 7, an electrically conductive connection plate can also be used, which is connected to the top metallization 11 cohesively, for example by soldering. There is likewise the possibility of making contact with the top metallization 11 with the aid of a pressure contact die, to be precise without producing a cohesive or positively locking connection between the pressure contact die and the top metallization 11.

In the same way, a semiconductor component 100 embodied in accordance with FIG. 4 could be installed and electrically connected on the circuit carrier 5. The sole difference in this case consists in the absence of the protective layer 3, and in the fact that the connecting layer 6 extends over the entire bottom side 16b of the bottom metallization 16 facing away from the semiconductor body 1.

A method by which a semiconductor component 100 embodied in accordance with FIG. 4 can be produced is explained by way of example below with reference to FIGS. 6 to 9G.

Figure 6:
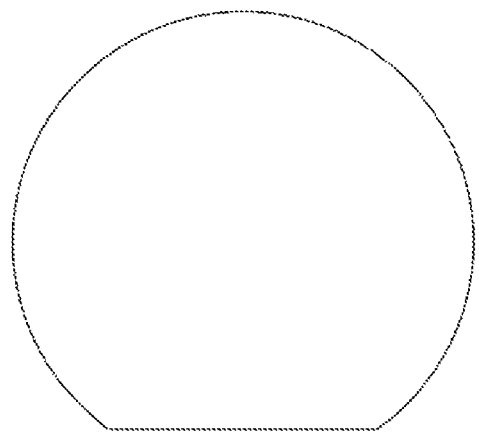
FIGS. 6-9G show different steps of a method for producing a semiconductor component embodied in accordance with FIG. 4.

In accordance with FIG. 6, for this purpose a wafer is provided, the processing of which is substantially concluded and which contains a multiplicity of identical raw chips which, however, are still in the wafer assemblage and from which a semiconductor component 100 in accordance with FIG. 1 to 3 or 4 can be produced. FIG. 6 shows the wafer merely schematically in plan view.

Figure 7:
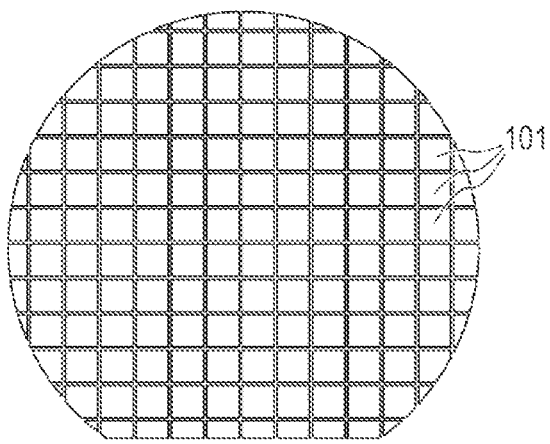

The raw chips 101 present in the wafer assemblage are then singulated, for example by sawing, such that they are present as individual raw chips 101 separated from one another, the result of which is shown in FIG. 7. The singulation can be effected, for example, by the wafer shown in FIG. 6 being adhesively bonded onto a sawing film in a conventional manner, from which the raw chips 101 singulated in accordance with FIG. 7 can be picked up and processed further, for example by means of a pick-and-place method.

Figure 8:
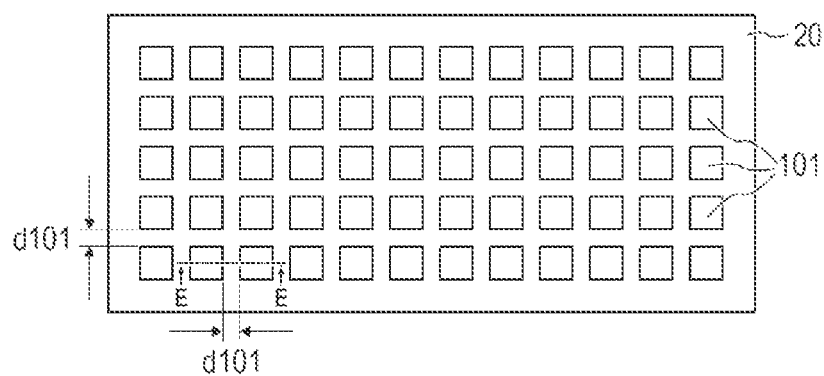

FIG. 8 shows a carrier 20 having an adhesive surface, onto which the singulated raw chips 101 are adhesively bonded with a predefined grid pitch. Here, as also in all the other configurations of the invention, the distance d101 between two adjacent raw chips 101 can be at least 100 μm in each case. By virtue of the raw chips 101 being fixed on the carrier 20, they can be processed further in the assemblage.

Figure 9A:
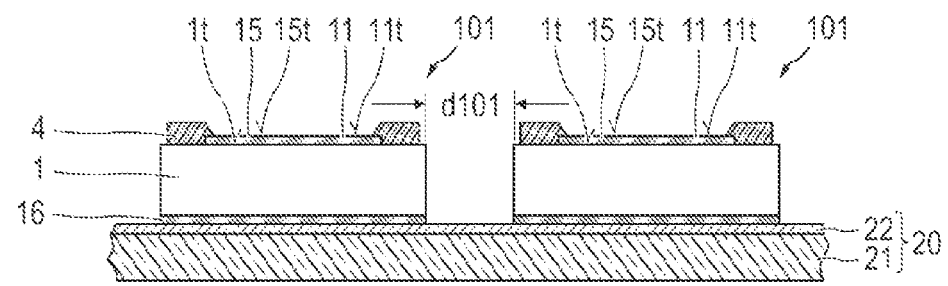
Figure 9B:
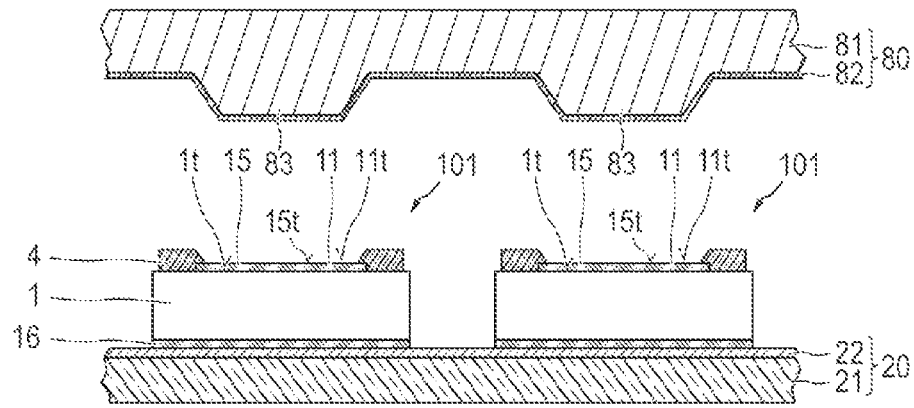

FIG. 9A shows a vertical section through this arrangement in a sectional plane E-E illustrated in FIG. 8. The sectional view shows two adjacent raw chips 101. The carrier 20 has a stable plate 21, which is provided with an adhesive layer 22 and by means of which the raw chips 101 are fixed on the carrier 20.

In order to provide the raw chips 101 with a moisture barrier, it is necessary for the later electrical contact areas, which are formed by the top metallization 11 or respectively the bottom metallization 16, to be kept free of the material of the moisture barrier 2. As is evident from FIG. 9B, a die 80 is provided for this purpose, said die having a stable shaped part 81 provided with an anti-adhesion coating 82 on its side facing the raw chips 101. During the further production method, the anti-adhesion coating 82 prevents the die 80 from adhering to an excessively great extent to the top metallizations 11 of the raw chips 101 and the moisture barrier to be produced, such that the die 80 can be removed again after the completion of the moisture barrier.

Figure 9C:
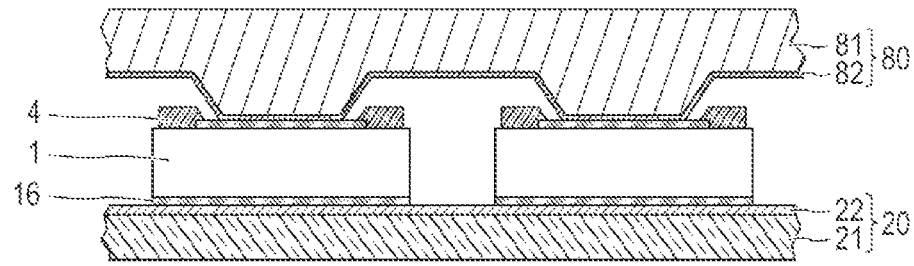

On its side facing the raw chips 101, the die 80 has a projection 83 having a planar surface for each of the raw chips 101, said surface making contact with the top metallization 11 of the relevant raw chip 101 after the die 80 has been placed onto the raw chips 101, the result of which is shown in FIG. 9C.

Figure 9D:
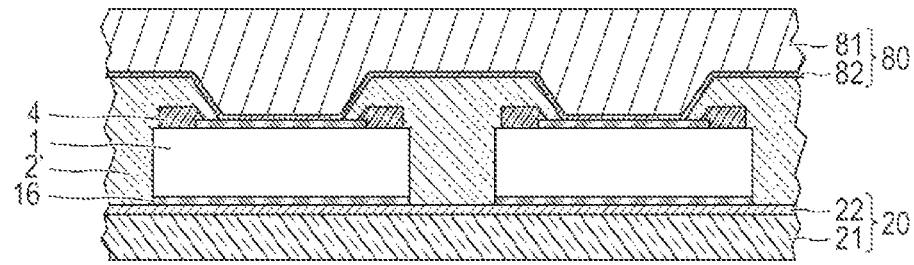

The carrier 20 and the die 80 pressed against it then form a mold with the raw chips 101 inserted therein. A pasty compound 2' can then be injected into this mold 20, 80 and subsequently cured. After curing, the pasty compound 2' forms the moisture barrier 2 already explained above. FIG. 9D shows the arrangement after the injection of the pasty compound 2'.

Once the pasty compound 2' has cured, the die 80 can be removed, the result of which is shown in FIG. 9E.

In order to produce individual semiconductor components 100 from this arrangement, the assemblage present in FIG. 9E is singulated by incisions 23 running between adjacent semiconductor components 100 within the moisture barrier 2 as shown in FIG. 9F. In this case, the separating cuts 23 extend right into the adhesive layer 22, but without completely severing the latter. This makes it possible to ensure that the singulated semiconductor components 100, as is shown in FIG. 9G, can be removed from the carrier 20. In order to facilitate the removal, the temperature of the carrier 20 can be increased, with the result that the adhesion of the adhesive layer 22 decreases. The individual semiconductor components in accordance with FIG. 9G are in each case identical to the semiconductor component 100 in accordance with FIG. 4.

Figure 10B:
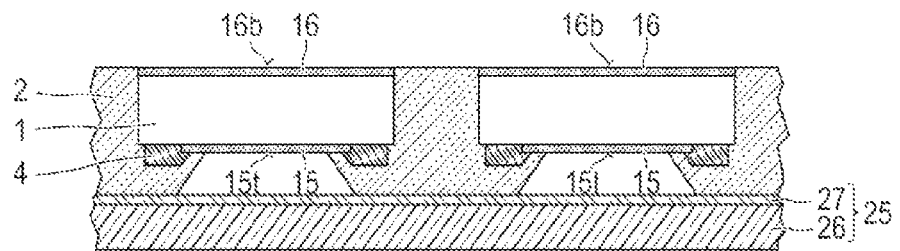

In order to produce a semiconductor component 100 constructed in accordance with FIGS. 1 to 3, it is necessary for each of the semiconductor chips 100 that are to be produced to be provided with a protective layer 3, which can be carried out for example proceeding from the arrangement in accordance with FIG. 9E. For this purpose, a second carrier 25 is placed onto the top side 2t of the moisture barrier 2 facing away from the first carrier 20, said second carrier comprising a rigid plate 26 provided with an adhesive layer 27 on its side facing the first carrier 20, the result of which is illustrated in FIG. 10A. FIG. 10B shows the arrangement in accordance with FIG. 10A turned upside down after the removal of the bottom carrier 20.

Figure 10C:
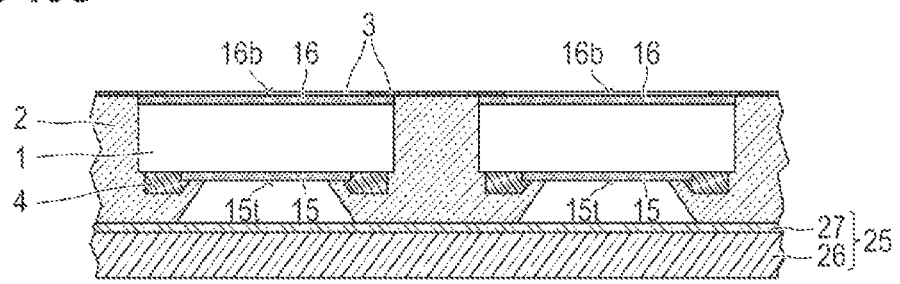

As is shown as the result in FIG. 10C, on the arrangement in accordance with FIG. 10B for each of the raw chips 101 the contact area between the lateral edge of the bottom metallization 16 and the moisture barrier 2, at its side facing away from the semiconductor body 1, is completely covered with a protective layer 3, for example a soldering resist. The protective layer 3 therefore forms a closed ring for each of the raw chips 101 and later for each of the semiconductor components 100 produced therefrom. The protective layer 3 can, for example, be applied as a closed layer and then be structured photolithographically.

Figure 10D:
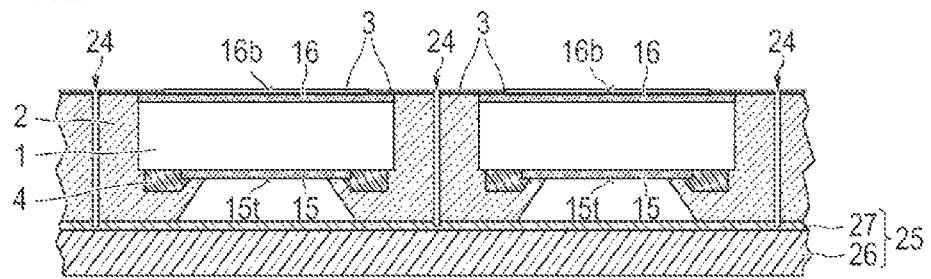

In order to produce individual, mutually separated semiconductor chips 100 embodied in accordance with the FIGS. 1 to 3, the assemblage shown in FIG. 10C is then singulated by separating cuts 24, for example by means of sawing. In this case, the separating cuts 24 extend right into the adhesive layer 27 without completely severing the latter, the result of which is shown in FIG. 10D.

Figure 10E:
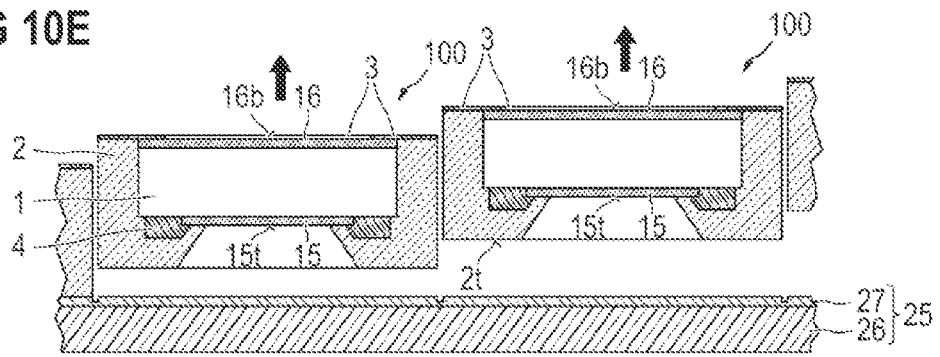

The individual semiconductor components 100 can then be removed from the second carrier 25, as is illustrated in FIG. 10E. In order to facilitate the removal, the temperature of the carrier 25 can be increased, with the result that the adhesion of the adhesive layer 27 decreases.

Figure 11:
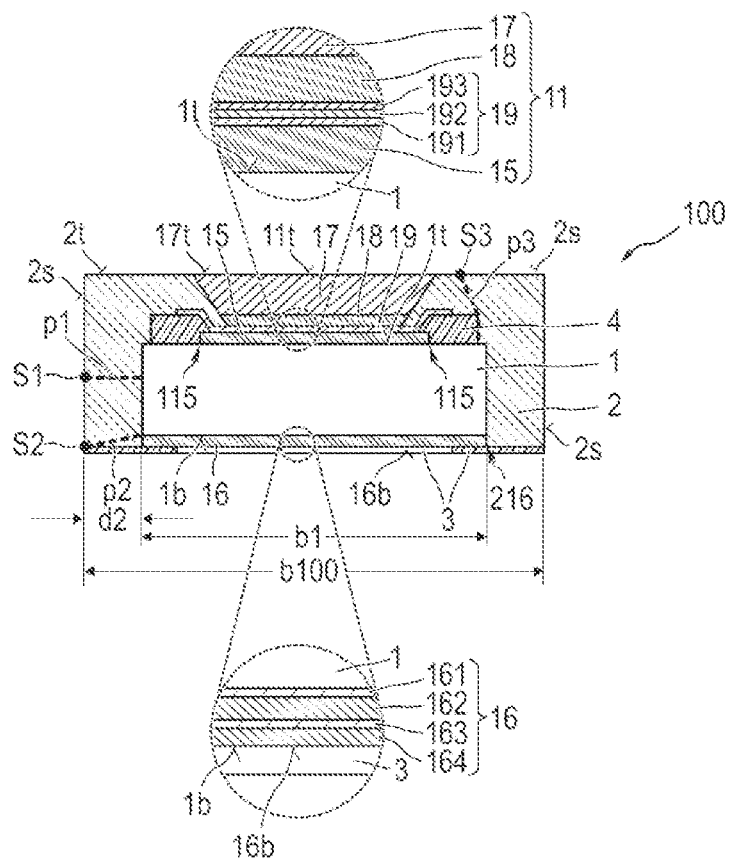
FIG. 11 shows a cross section through a semiconductor component, the top metallization of which has a contact piece.

FIG. 11 shows a further example of a semiconductor component 100, the semiconductor body 1 of which is provided with a top metallization 11, a bottom metallization 16 and a moisture barrier 2, such that the top metallization 11, the bottom metallization 16 and the moisture barrier 2 form a closed casing around the semiconductor body 1.

While in the semiconductor components explained above the top side 11*t* of the top metallization 11 was lowered relative to the top side 2*t* of the moisture barrier 2, the top metallization 11 of the semiconductor component 100 in accordance with FIG. 11 has an electrically conductive, metallic contact piece 17, which is soldered to the top metallization layer 15 by means of a solder layer 18. Optionally, a barrier layer 19 can be arranged between the top metallization 15, on the one hand, and the contact piece 17 and the solder layer 18, on the other hand, said barrier layer preventing material from the contact piece 17 and/or the solder layer 18 from diffusing into the semiconductor body 1. Such a barrier layer 19 is advantageous primarily if the contact piece 17 comprises copper or consists of copper, since the penetration of copper into the semiconductor body 1 would significantly alter the electrical properties thereof.

In the case of the arrangement in accordance with FIG. 11, the barrier layer 19 has a first partial layer 191 composed of titanium, a second partial layer 192 composed of tungsten and a third partial layer 193 composed of copper, wherein the first, second and third partial layers 191, 192 and 193, from the side of the barrier layer 19 facing the semiconductor body 1, are arranged successively in a direction away from the semiconductor body 1. While the first partial layer 191 composed of titanium and the second partial layer 192 comprised of tungsten constitute a barrier for the penetration of copper into the semiconductor body 1, the third partial layer 193 ensures the solderability of the barrier layer 19. Instead of the first partial layer 191 and the second partial layer 192, it is also possible to provide only the first partial layer 191 composed of titanium or only the second partial layer 192 composed of tungsten, or the order of the first partial layer 191 and of the second partial layer 192 can be interchanged, such that the first partial layer 191 composed of titanium is arranged between the second partial layer 192 composed of tungsten and the third partial layer 193 composed of copper. Alternatively or additionally, the barrier layer 19 can also comprise a layer composed of a titanium-tungsten alloy or consist of a titanium-tungsten alloy.

Since the contact piece 17 is electrically conductively connected to the top metallization layer 15, the top side 17*t* of the contact piece 17 facing away from the semiconductor body 1 can be used as an electrical contact area for externally making contact with the semiconductor component 100. As a result of the contact piece 17, the top contact area 17*t* of the semiconductor component 100 is not lowered relative to the top side 2*t* of the moisture barrier 2 facing away from the semiconductor body 1, or is at least lowered to a lesser extent than is the case for the semiconductor components 100 explained with reference to the preceding FIGS. 1 to 10E. In particular, the top side 17*t* of the contact piece 17 and the top side 2*t* of the moisture barrier 2 can adjoin one another in a flush manner alongside one another and be arranged in a common plane.

The construction at the bottom side of the semiconductor component 100, in particular the construction of the bottom metallization 16 and of the optional protective layer 3, is identical to the construction explained with reference to FIGS. 1 to 4.

Figure 12:
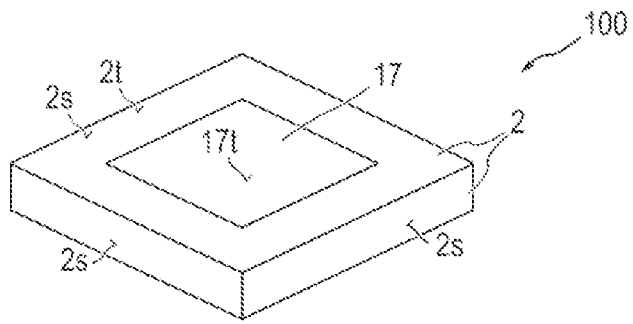
FIG. 12 shows a perspective view of the top side of the semiconductor component in accordance with FIG. 11.

FIG. 12 shows a perspective plan view of the top side and FIG. 13 a perspective plan view of the bottom side of the semiconductor component 100 explained with reference to FIG. 11.

Figure 13:
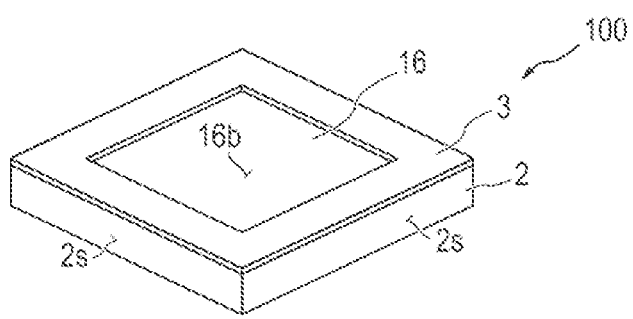
FIG. 13 shows a perspective view of the bottom side of the semiconductor component in accordance with FIG. 11.
Figure 14:
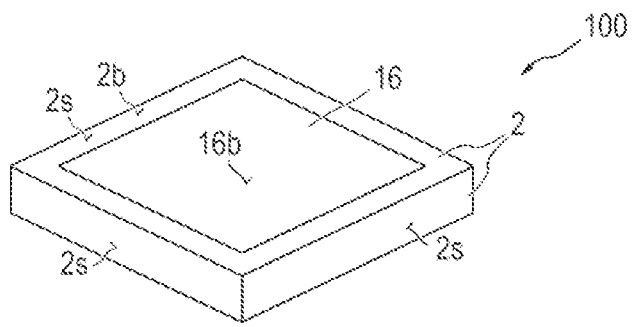
FIG. 14 shows a perspective view of the bottom side of a semiconductor component, the construction of which differs from the construction of the semiconductor component shown in FIG. 11 merely in the absence of the soldering resist layer.

The semiconductor component 100 in accordance with FIG. 14 is identical to the semiconductor component 100 in accordance with FIG. 13, with merely the optional protective layer 3 being absent.

Figure 15:
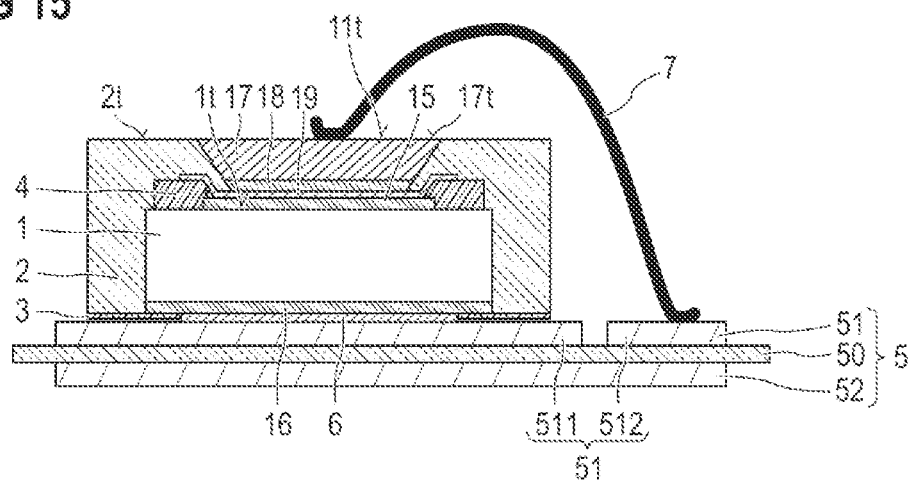
FIG. 15 shows a semiconductor module comprising a circuit carrier, on which a semiconductor component in accordance with FIGS. 11 to 13 is mounted.

FIG. 15 shows a semiconductor module, the construction of which differs from the semiconductor module in accordance with FIG. 5 merely in that the semiconductor component 100 has a construction in accordance with FIGS. 11 to 13, and that the bonding wire 7, at its first bonding location, is bonded directly to the top side 17*t* of the contact piece 17 rather than directly to the top side 15*t* of the top metallization layer 15.

A method for producing a semiconductor component 100 embodied in accordance with FIG. 15 is explained below with reference to FIGS. 16A to 16J. In the same way as was described above with reference to the FIGS. 6, 7, 8, firstly a finished processed wafer is provided (FIG. 6), singulated to form raw chips 101 separated from one another (FIG. 7), and the singulated raw chips 101 are placed in a predefined grid onto the adhesive surface of a first carrier 20 (FIG. 8).

Figure 16A:
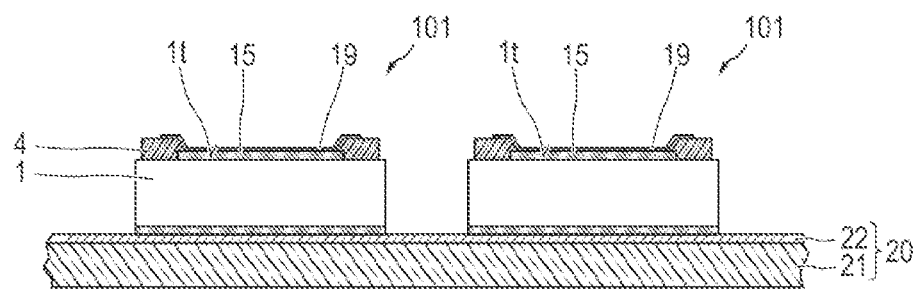
FIGS. 16A-H and 16J show different steps of a method for producing a semiconductor component embodied in accordance with FIGS. 11 to 14.

FIG. 16A shows a vertical section through a portion of the first carrier 20—populated in this way—in accordance with FIG. 8 in a sectional plane E-E. The arrangement in accordance with FIG. 16A corresponds to the arrangement in accordance with FIG. 9A with the sole difference that the raw chips 101 have additionally already been provided with the barrier layer 19, which was applied in the context of the production of the not yet singulated wafer (FIG. 6).

Figure 16B:
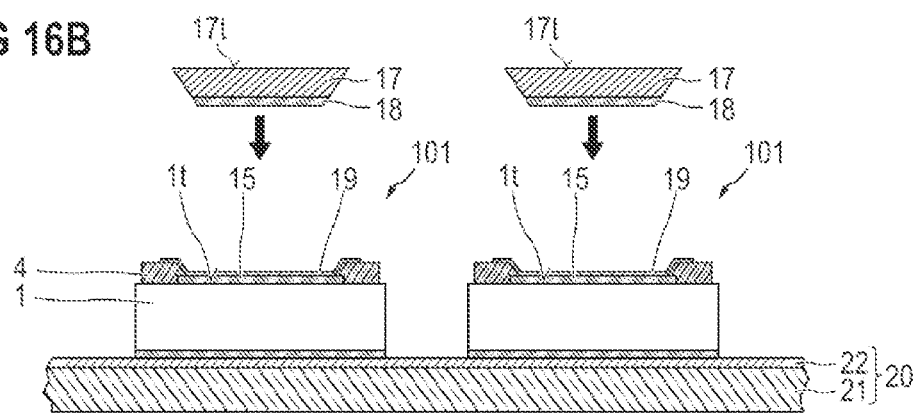

As is furthermore shown in FIG. 16B, a contact piece 17 is then provided for each of the raw chips 101, which contact piece can optionally be presoldered with a solder 18.

Figure 16C:
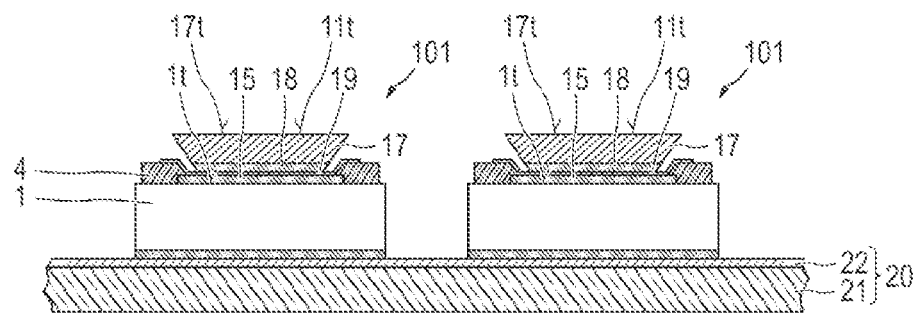

Each of the soldered contact pieces 17 is then placed with the solder 18 onto the barrier layer 19 of one of the raw chips 101 and, by means of the melting and subsequent cooling of the solder 18, is cohesively connected to the barrier layer 19 and thus also to the semiconductor body 1, the result of which is shown in FIG. 16C. In principle, however, it is not necessary to use a contact piece 17 presoldered with a solder 18. In this regard, the solder 18 can, for example, in each case also be placed onto the barrier layer 19 as a lamina or be printed on as a paste and then melted and subsequently cooled.

Figure 16D:
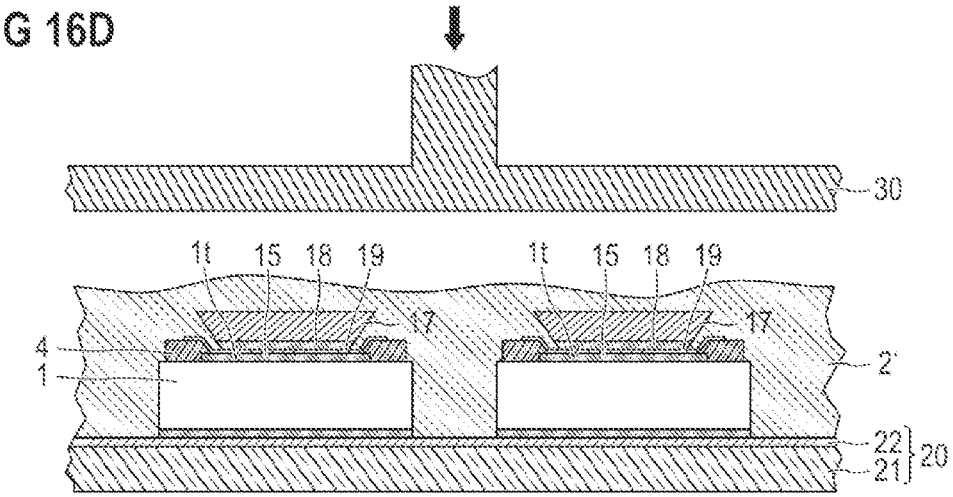
Figure 16E:
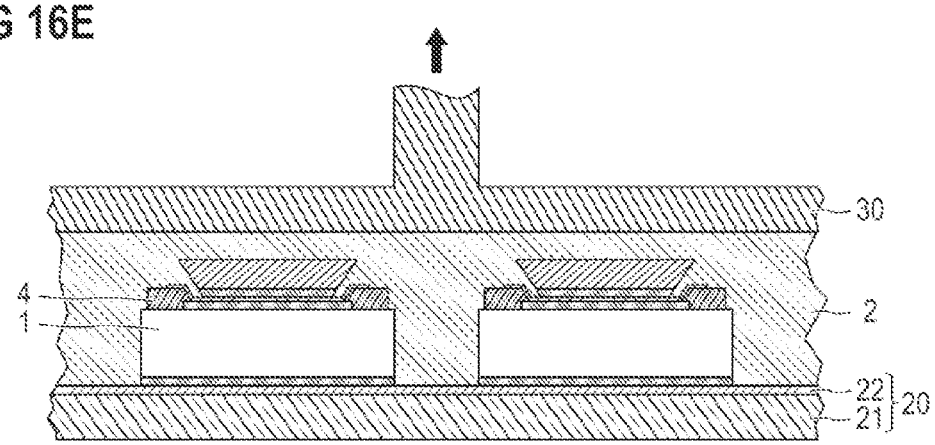
Figure 16F:
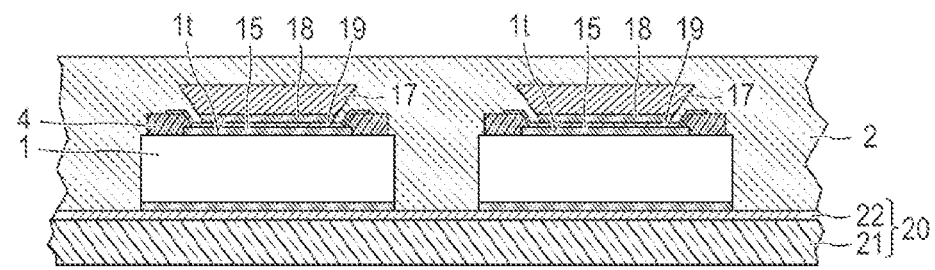

After the individual contact pieces 17 have been soldered to the respective barrier layer 19, a pasty compound 2', as is illustrated in FIG. 16D, is applied to the totality of the raw chips 101 arranged on the first carrier 20 and each provided with a contact piece 17 and is pressed in the direction of the first carrier 20 with the aid of a die 30, such that the pasty compound 2' fills all interspaces. After the curing of the pasty compound 2', the latter forms the moisture barrier 2, and the die 30 can be removed, as is shown in FIG. 16E. FIG. 16F, finally, shows the arrangement after the die 30 has been removed.

Figure 16G:
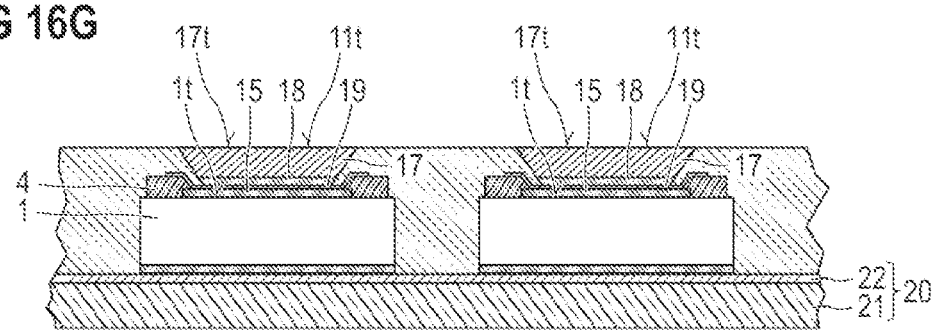

In a subsequent step, the arrangement shown in FIG. 16F is ground on its side facing away from the first carrier 20 in such a way that the contact pieces 17, as is shown in FIG. 16G, are exposed and are accessible as electrical contacts of the semiconductor component 100 from the outside.

Figure 16H:
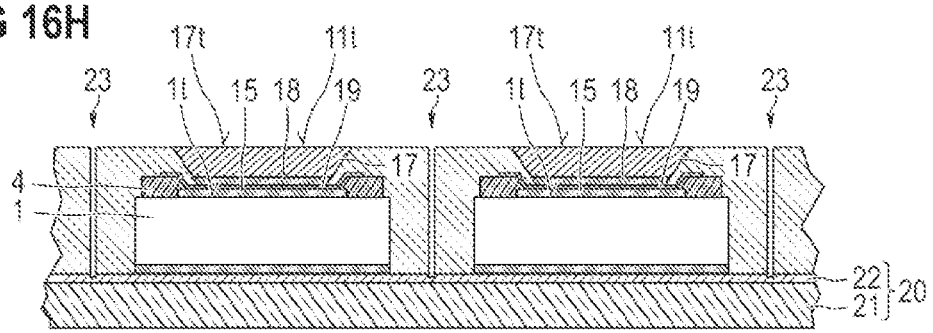
Figure 16J:
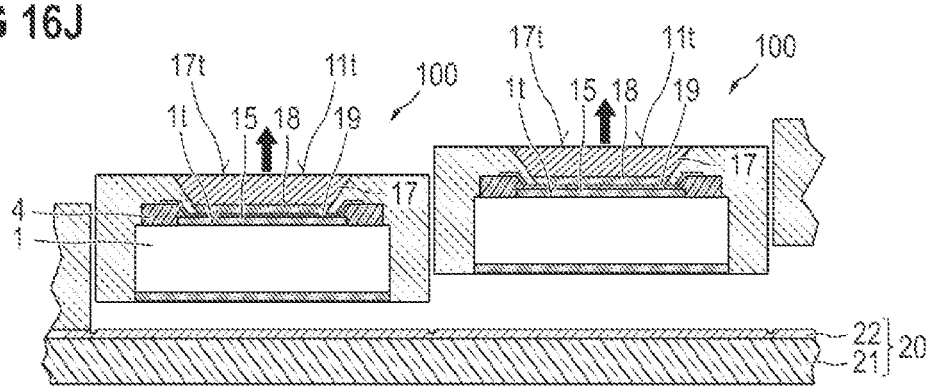

The arrangement in accordance with FIG. 16G can then be singulated by separating cuts 23, as has already been described with reference to FIG. 9F, the result of this being shown in FIG. 16H. Afterward, the singulated semiconductor components 100 can be detached from the first carrier 20, as has already been described with reference to FIG. 9G and the result of which is shown in FIG. 16J. The construction of the semiconductor components 100 produced in this way corresponds to the construction of the semiconductor component 100 in accordance with FIG. 14.

If the intention is to produce a semiconductor component 100 whose construction corresponds to the construction explained with reference to FIGS. 11 to 13, the semiconductor component must additionally be provided with the optional protective layer 3. For this purpose, on the arrangement in accordance with FIG. 16G, in a manner corresponding to the method explained with reference to FIGS. 10A to 10E, a second carrier 25 can be fitted and the first carrier 20 can be removed. Afterward, the protective layer 3 can be applied and the arrangement can then be singulated by separating cuts 24.

Figure 17:
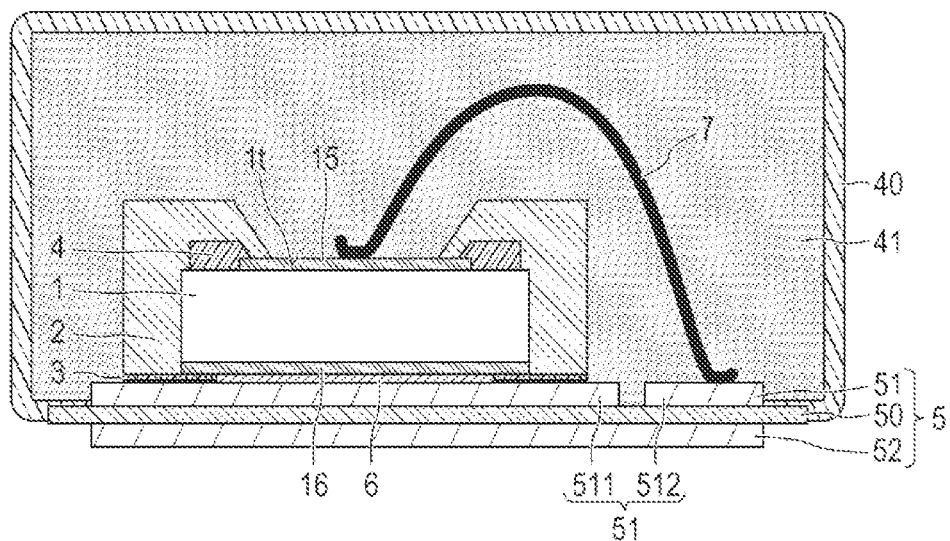
FIG. 17 shows a semiconductor module in accordance with FIG. 5, which additionally has a housing into which a soft potting compound is filled.

FIG. 17 shows a cross section through a semiconductor module, the construction of which is identical to the construction of the semiconductor module in accordance with FIG. 5 but which is additionally mounted in a housing 40, into which a soft potting compound 41, for example a silicone gel, was subsequently filled. The illustration of the electrical connections projecting from the interior of the housing 40 and serving for connecting up the semiconductor module has been dispensed with in the present case, and also in the further FIGS. 18, 22 and 24.

Figure 18:
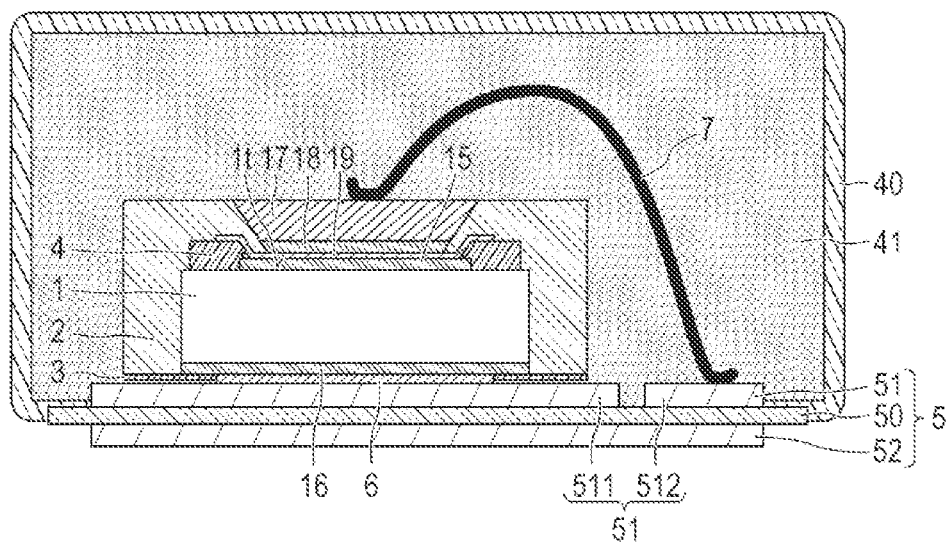
FIG. 18 shows a semiconductor module in accordance with FIG. 15, which additionally has a housing into which a soft potting compound is filled.

FIG. 18 correspondingly shows a semiconductor module, the construction of which corresponds to the semiconductor module in accordance with FIG. 15 but which was additionally incorporated into a housing 41, into which a soft potting compound 41, for example a silicone gel, was then filled.

Figure 19A:
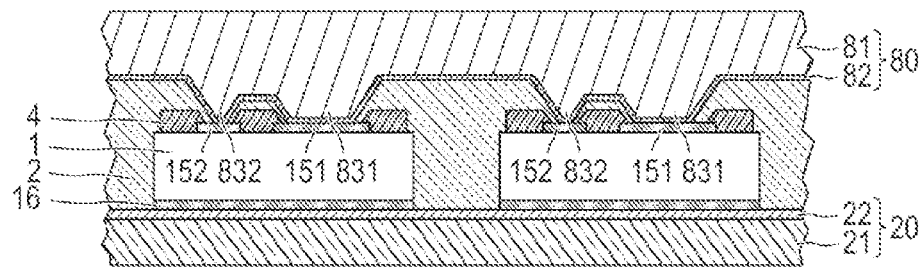
FIG. 19A shows an intermediate step of a method for producing a plurality of semiconductor components in which the top metallization has in each case two segments separated from one another.
Figure 19B:
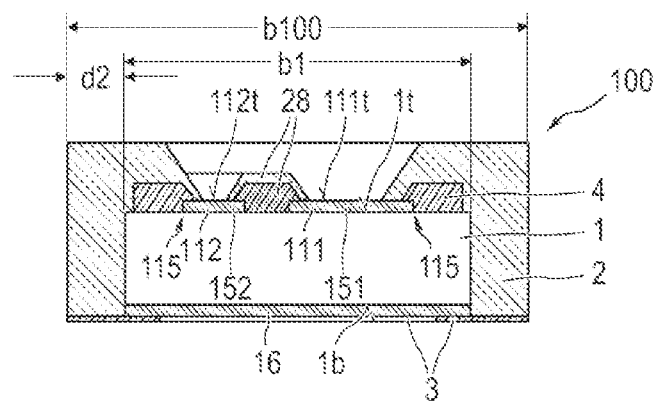
FIG. 19B shows a vertical section through a semiconductor component which was produced in accordance with the method explained with reference to FIG. 19A.
Figure 19C:
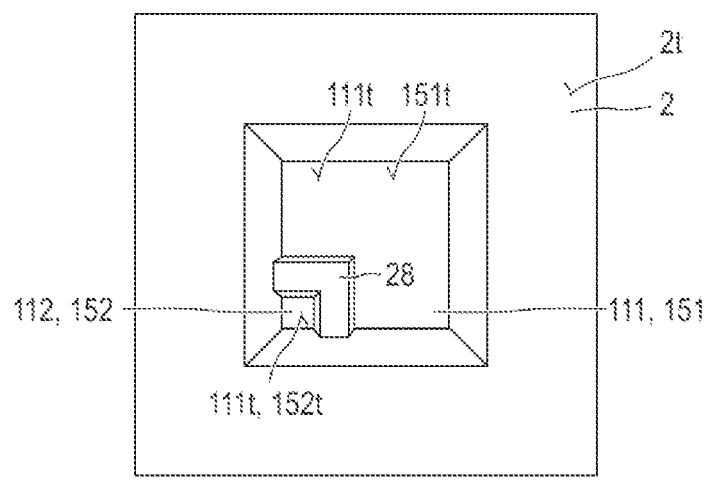
FIG. 19C shows a plan view of the semiconductor component in accordance with FIG. 19B.
Figure 20A:
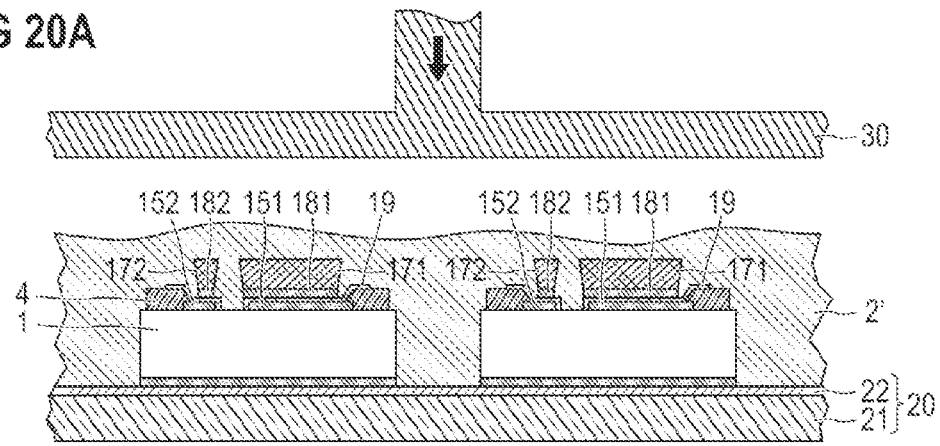
FIG. 20A shows an intermediate step of a method for producing a plurality of identical semiconductor components in which the top metallization has in each case two segments separated from one another, a contact piece being soldered onto each of said segments.
Figure 20B:
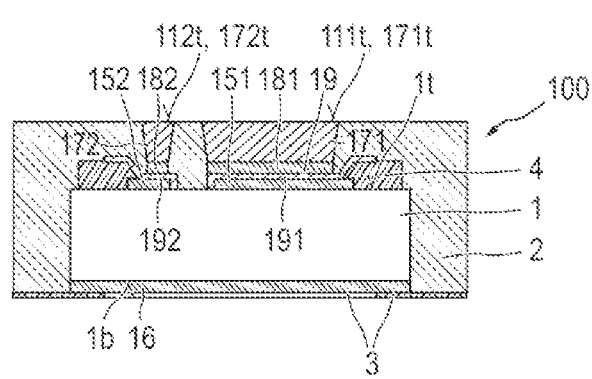
FIG. 20B shows a vertical section through a semiconductor component which was produced in accordance with the method explained with reference to FIG. 20A.
Figure 20C:
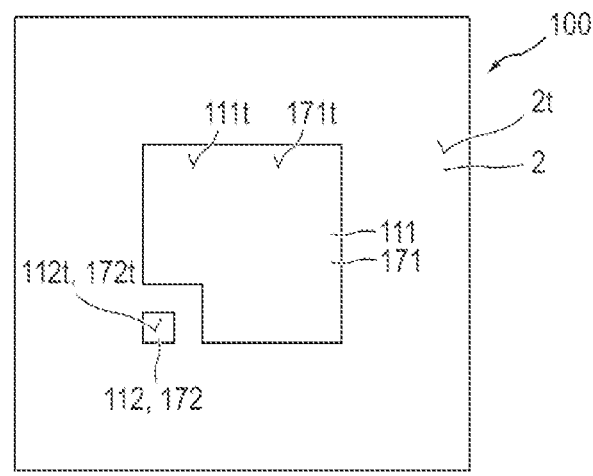
FIG. 20C shows a plan view of the semiconductor component in accordance with FIG. 20B.

The semiconductor components 100 explained up to now have been provided in each case only with exactly one electrical connection contact at the top side, said connection contact having been formed by the top metallization 11. Such configurations are suitable for example for producing diodes or other components which require only a single electrical connection contact at their top side. However, if other electrical components, e.g. controllable semiconductor components such as, for example, insulated gate semiconductor components (IGFET=Insulated Gate Field Effect Transistor), e.g. IGBTs or MOSFETs, but also junction field effect transistors (JFETs=Junction Field Effect Transistor) or thyristors, are intended to be produced, the top metallization 11 can also have two or more sections 111, 112 separated from one another, as is shown in FIGS. 19A to 19C. In this context, "separated" means that the sections 111 and 112 separated from one another are not electrically conductively connected to one another.

The section 111 and the bottom metallization 16 can constitute, for example, an anode electrode and a cathode electrode, a cathode electrode and an anode electrode, a drain electrode and a source electrode, a source electrode and a drain electrode, an emitter electrode and a collector electrode, or a collector electrode and an emitter electrode. The section 112 can be a gate electrode or a base electrode.

The arrangement in accordance with FIG. 19A corresponds to the arrangement in accordance with FIG. 9D with the sole difference that the top metallization 11 of each of the raw chips 101 has two sections 111 and 112 separated from one another, and that the die 80, with respect to each of the raw chips 101, has a separate projection 831 and 832 respectively for each of the sections 111, 112.

FIGS. 19B and 19C show a vertical section through and respectively a plan view of a semiconductor component 100 produced by the method explained with reference to FIG. 19A. As can be discerned, the two sections 111 and 112 of the top metallization 11 are separated from one another by a web 28 provided by a section of the moisture barrier 2.

In the case of the types of component explained with reference to the description of FIG. 18, in which the top metallization 11 has two or more sections 111, 112 separated from one another, each of the semiconductor components 100 has a number of mutually spaced-apart sections 151, 152 of the top metallization layer 15 having top sides 151t and 152t, respectively, said number corresponding to the number of separated sections 111, 112. Said sections 151, 152 are each provided with a separate contact piece 171 and 172, respectively, by virtue of the contact pieces 171, 172 being soldered onto the associated section 151 and 152, respectively, each provided with a section 191 and 192, respectively, of the barrier layer 19. The construction and production principle is just like that already explained with reference to FIGS. 11 to 16J for the soldering of the contact piece 17 onto the top metallization layer 15 provided with the barrier layer 19. The difference is merely that a plurality of sections 151, 152 of the top metallization 15 are present, wherein on each of the sections 151, 152 there are applied a section 191 and 192, respectively, of a barrier layer, a section 181 and 182, respectively, of a solder layer and a contact piece 171 and 172, respectively. The construction of the layer sequence 151, 191, 181, 171 and the construction of the layer sequence 152, 192, 182, 172 are in this case identical to the construction of the layer sequence 15, 19, 18, 17 explained with reference to FIG. 11. The contact pieces 171, 172 each have a top side 171t and 172t, respectively, which are identical to the top sides 111t and 112t of the sections 111 and 112, respectively, of the top metallization 11. The top sides 111t and 112t of the finished semiconductor component 100, at least when the latter has not yet been installed, are accessible from the external environment of said semiconductor component. Therefore, they can be electrically contact-connected in a simple manner, for example by wire bonding or by a metallic contact plate being soldered on.

As is explained by way of example below with reference to FIGS. 21 to 24, two or more semiconductor components can be jointly installed in a semiconductor module, a first semiconductor component 100 of which is constructed in accordance with one of the semiconductor components 100 explained above and is provided with a moisture barrier 2, while the second semiconductor component 100' is a conventional semiconductor component without such a moisture barrier 2. The first semiconductor component 100 can optionally comprise a first semiconductor body 1 produced from the basic semiconductor material silicon carbide (SiC), while the second semiconductor body 1' of the second semiconductor component 100' is produced from a basic semiconductor material that differs from silicon carbide. For example, the basic semiconductor material from which the second semiconductor body 1' is produced can be silicon, gallium arsenide, but also any other basic semiconductor material.

In FIGS. 21 to 24, the first semiconductor component 100 and the second semiconductor component 100' are arranged by way of example on different metallization sections 511, 512 on a top metallization layer 51 of a common carrier 5. As an alternative thereto, however, the first semiconductor component 100 and the second semiconductor component 100' can also be arranged and optionally electrically interconnected with one another on different carriers. In this case, the circuit carrier 5 comprises a dielectric insulation carrier 50, which is embodied as a thin laminar and which can consist of a ceramic. The insulation carrier 50 has a planar top main surface 50t, to which a top metallization layer 51 is applied.

The first semiconductor component 100 is embodied in accordance with FIGS. 1 to 3 in the case of the arrangement in accordance with FIG. 21 and is embodied in accordance with FIG. 11 in the case of the arrangement in accordance with FIG. 23. In principle, however, any of the other semiconductor components 100 provided with a moisture barrier 2 and explained above can be used for the first semiconductor component 100.

FIG. 22 shows the arrangement in accordance with FIG. 21 and FIG. 24 shows the arrangement in accordance with FIG. 23 in each case after the mounting thereof in a housing 40, and after a potting compound 41, for example a silicone gel, has been filled into the housing.

In the case of semiconductor modules as explained with reference to FIGS. 22 and 24, the first semiconductor component 100 and the second semiconductor component 100' can be arranged in a common housing 40, into which a silicone gel 41 is filled, which extends from the circuit carrier 5 at least as far as over the sides of both the first semiconductor component 100 and the second semiconductor component 100' that face away from the circuit carrier 5. Since the moisture barrier 2 has a large thickness, the first semiconductor body 1 of the first semiconductor component 100 in every lateral direction r parallel to the planar main surface 50t is at a minimum distance d141 from the silicone gel 41 which is at least 50 μm greater than the minimum distance d141' between the semiconductor body 100' of the second semiconductor component 100' and the silicone gel 41 in the lateral direction r. In this case, the distance d141' can be equal to zero, or alternatively greater than zero, for example if the second semiconductor body 100' is provided in a manner coated with a thin layer.

The semiconductor components 100 having a moisture barrier 2 as described on the basis of the exemplary embodiment explained above can have a maximum width b100 in every direction parallel to the bottom side 16b of the bottom metallization 16, and the semiconductor body 1 of said semiconductor components 100 can have, in each case in the same direction, a maximum width b1, see FIGS. 1 and 11. In this case, in each of said directions it can hold true that the difference b100 minus b1 between the minimum width b100 and the maximum width b1 is at least 250 μm.

Independently of this, a semiconductor component 100 can have, in every direction parallel to the bottom side 16b of the bottom metallization 16, a maximum width b100 that is less than 5 mm, or even less than 3 mm.

Likewise independently of the other parameters, the semiconductor body 1 of a semiconductor component 100 can have, in every direction parallel to the bottom side 16b of the bottom metallization 16, a maximum width b1 that is less than 4.9 mm.

Furthermore, the moisture barrier 2 can have, in every direction parallel to the bottom side 16b of the bottom metallization 16, a width d2 (likewise see FIGS. 1 and 11) of at least 50 μm.

All of the circuit carriers 5 explained above can be arbitrary printed circuit boards or other carriers. In particular, however, such a circuit carrier can comprise a dielectric insulation carrier 50, which can consist of a ceramic. Suitable ceramics are metal or transition metal oxides, nitrides or carbides, insofar as they are electrically insulating, such as, for example, aluminum oxide ($Al_2O_3$), aluminum nitride (AlN), beryllium oxide (BeO), zirconium oxide ($ZrO_2$), silicon nitride ($Si_3N_4$), or silicon carbide (SiC).

The insulation carrier 50 embodied as a flat laminar has a planar or substantially planar top main surface 50t, to which a structured or unstructured top metallization layer 51 is applied. In this case, "main surface" is understood to mean one of the two largest-area sides of the insulation carrier 50. Optionally, the circuit carrier 5 can also have a structured or unstructured bottom metallization layer 52 applied to the opposite side of the insulation carrier 50 relative to the top main surface 50t. In this case, the top metallization layer 51 and the bottom metallization layer 52 can be electrically insulated from one another by the insulation carrier 50 situated between them.

The top metallization layer 51 and—if present—the bottom metallization layer 52 can additionally be applied directly to the insulation carrier 50, that is to say make mechanical contact directly with the latter. The metallization layers have good electrical conductivity; they can consist for example of copper or aluminum, or of copper or aluminum alloys. In principle, however, other substances having good electrical conductivity can also be used.

A circuit carrier 5 can be embodied, for example, as a DCB substrate (DCB=Direct Copper Bonded) (insulation carrier composed of aluminum oxide and top metallization layer 51 and, if appropriate, bottom metallization layer 52 composed of copper or a copper alloy).

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
   a semiconductor body having a top side to which a top metallization is applied, and a bottom side opposite the top side and to which a bottom metallization is applied, such that the semiconductor body, the top metallization and the bottom metallization form a composite; and
   a moisture barrier which completely seals the semiconductor body in cooperation with the top metallization and the bottom metallization,
   wherein the top metallization has a top side facing away from the semiconductor body,
   wherein the top side off the top metallization has one or more surface sections which are spaced apart from one another and not covered by the moisture barrier.

2. The semiconductor component of claim 1, wherein the semiconductor body comprises silicon carbide.

3. The semiconductor component of claim 1, wherein the top metallization, the bottom metallization and the moisture barrier form a closed encapsulation that completely encloses the semiconductor body.

4. The semiconductor component of claim 1, wherein the top metallization is structured and has two metallization sections spaced apart from one another.

5. The semiconductor component of claim 1, wherein each of the surface sections is freely accessible from outside the semiconductor component.

6. The semiconductor component of claim 1, wherein a bottom side of the bottom metallization facing away from the semiconductor body is not covered by the moisture barrier.

7. The semiconductor component of claim 1, wherein the moisture barrier makes contact with the bottom metallization along a contact area closed in a ring-shaped fashion.

8. The semiconductor component of claim 7, wherein an edge of the contact area facing away from the semiconductor body is completely covered with a soldering resist layer closed in a ring-shaped fashion.

9. The semiconductor component of claim 1, wherein the moisture barrier is electrically insulating and comprises an epoxy resin or a polyurethane-based material.

10. The semiconductor component of claim 1, wherein the moisture barrier consists of a uniform material or a homogeneous material mixture.

11. The semiconductor component of claim 1, wherein the top metallization has a top metallization layer and a metallic contact piece soldered by a solder layer onto a side of the top metallization layer facing away from the semiconductor body.

12. The semiconductor component of claim 11, wherein a section of the moisture barrier is arranged between the top metallization layer and the metallic contact piece.

13. The semiconductor component of claim 11, wherein the top metallization has a barrier layer arranged between the top metallization layer and the metallic contact piece and which comprises tungsten.

14. The semiconductor component of claim 1, wherein at least a section of a bottom side of the bottom metallization facing away from the semiconductor body is exposed such that the bottom side of the bottom metallization is freely accessible from outside the semiconductor component in an uninstalled state of the semiconductor component.

15. The semiconductor component of claim 1, wherein:
the moisture barrier has a surface freely accessible from outside the semiconductor component in an uninstalled state of the semiconductor component; and
for every location on the freely accessible surface of the moisture barrier, every path which leads from said location to the semiconductor body and which runs exclusively within the moisture barrier has a length of at least 50 μm.

16. The semiconductor component of claim 1, wherein the moisture barrier makes mechanical contact directly with the semiconductor body.

17. A semiconductor module, comprising:
a circuit carrier;
a first semiconductor component arranged on and cohesively connected to a top circuit carrier metallization of the circuit carrier, the first semiconductor component comprising a semiconductor body having a top side to which a top metallization is applied, and a bottom side opposite the top side and to which a bottom metallization is applied, such that the semiconductor body, the top metallization and the bottom metallization form a composite, and a moisture barrier which completely seals the semiconductor body in cooperation with the top metallization and the bottom metallization; and
a second semiconductor component comprising a semiconductor body of a basic semiconductor material other than silicon carbide and which is arranged on and cohesively connected to the circuit carrier.

18. The semiconductor module of claim 17, wherein:
the circuit carrier has a dielectric insulation carrier embodied as a hi n laminar and having a planar main surface, the top circuit carrier metallization being applied to the dielectric insulation carrier;
the first semiconductor component and the second semiconductor component are arranged in a common housing;
a silicone gel is filled into the common housing and extends from the circuit carrier at least as far as over those sides of both the firs-t semiconductor component and the second semiconductor component which face away from the circuit carrier; and
the semiconductor body of the first semiconductor component in every lateral direction parallel to the planar main surface is at a minimum distance from the silicone gel which is at least 50 μm greater than the minimum distance between the semiconductor body of the second semiconductor component and the silicone gel in the lateral direction.

19. A semiconductor component, comprising:
a semiconductor body having a top side to which a top metallization is applied, and a bottom side opposite the top side and to which a bottom metallization is applied, such that the semiconductor body, the top metallization and the bottom metallization form a composite; and
a moisture barrier which completely seals the semiconductor body in cooperation with the top metallization and the bottom metallization,
wherein at least a section of a bottom side of the bottom metallization facing away from the semiconductor body is exposed such that the bottom side of the bottom metallization is freely accessible from outside the semiconductor component in an uninstalled state of the semiconductor component.

* * * * *